United States Patent
Onozaki et al.

(10) Patent No.: US 8,533,646 B1
(45) Date of Patent: Sep. 10, 2013

(54) APPARATUS, METHOD AND MEDIUM STORING PROGRAM FOR DESIGNING SEMICONDUCTOR INTEGRATED CIRCUIT

(75) Inventors: Yasutomo Onozaki, Chiba (JP); Tetsuaki Utsumi, Yokohama (JP); Akira Wada, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/600,502

(22) Filed: Aug. 31, 2012

(30) Foreign Application Priority Data

Mar. 7, 2012 (JP) .................................. 2012-050202

(51) Int. Cl.
*G06F 17/50* (2006.01)
(52) U.S. Cl.
USPC ......................................................... 716/110
(58) Field of Classification Search
USPC ................................................ 716/100, 110
See application file for complete search history.

(56) References Cited

U.S. PATENT DOCUMENTS

| 5,729,467 | A * | 3/1998 | Katsumata et al. ........... 716/129 |
| 7,552,373 | B2 | 6/2009 | Wang et al. |
| 8,086,889 | B2 | 12/2011 | Ito et al. |
| 2003/0154433 | A1 | 8/2003 | Wang et al. |
| 2009/0113230 | A1 | 4/2009 | Ito et al. |
| 2011/0066992 | A1 * | 3/2011 | Sandy et al. .................. 716/122 |

FOREIGN PATENT DOCUMENTS

| JP | 2005-517189 | 6/2005 |
| JP | 2005-223171 | 8/2005 |
| JP | 2007-133517 | 5/2007 |
| JP | 2009-109192 | 5/2009 |

* cited by examiner

*Primary Examiner* — Suchin Parihar
(74) *Attorney, Agent, or Firm* — Oblon, Spivak, McClelland, Maier & Neustadt, L.L.P.

(57) ABSTRACT

According to one embodiment, a designing apparatus includes a register position determining module, a net list generator, and a layout data generator. The register position determining module determines a register position on a layout of a semiconductor integrated circuit from a hardware description. The net list generator generates a net list according to the register position. The layout data generator generates layout data based on the net list. The layout data indicates the layout of the semiconductor integrated circuit.

13 Claims, 7 Drawing Sheets

| COMPRESSING PATTERN ID | COMPRESSOR CM1 | COMPRESSOR CM2 | TOTAL WIRE LENGTH |
|---|---|---|---|
| 0 | SCa1~SCa3 | SCb1~SCb3 | L0 |
| 1 | SCa1~SCa3 SCb1 | SCb2 SCb3 | L1 |
| 2 | SCa1, SCa3 SCb2, SCb3 | SCa2 SCb1 | L2 |

APPARATUS, METHOD AND MEDIUM STORING PROGRAM FOR DESIGNING SEMICONDUCTOR INTEGRATED CIRCUIT

CROSS REFERENCE TO RELATED APPLICATION(S)

This application is based upon and claims the benefit of priority from the prior Japanese Patent Application No. 2012-50202, filed on Mar. 7, 2012, the entire contents of which are incorporated herein by reference.

FIELD

Embodiments described herein relate generally to an apparatus for designing a semiconductor integrated circuit, a computer-implemented method for designing the semiconductor integrated circuit and a medium storing a computer program for designing the semiconductor integrated circuit.

BACKGROUND

Generally, in designing a semiconductor integrated circuit, layout data is generated and a test is performed based on the layout data.

A scan test is well known as a method for testing the semiconductor integrated circuit. Nowadays a compression scan test that is of an application of the scan test is used. The compression scan test is performed using a scan test module incorporated in the semiconductor integrated circuit. The scan test module is a combination of a scan chain and a compression scan circuit. The compression scan circuit includes a decompressor and a compressor. One end of each of the decompressor and the compressor is connected to an external circuit (for example, semiconductor inspection apparatus) of the semiconductor integrated circuit. The other end of each of the decompressor and the compressor is connected to the scan chain. The scan chain is classified into groups (hereinafter referred to as "functional groups") in each functional block. The compression scan circuit is disposed outside or inside the functional group.

However, in generating the layout data, when a cell position in the semiconductor integrated circuit is determined in a unit of functional group, positional relationship between cells, which relates to an operation signal of the semiconductor integrated circuit, is considered but positional relationship between cells, which relates to a scan signal for the scan test to be added, is not considered. In other words, when the cell position in the semiconductor integrated circuit is determined, an operation of the semiconductor integrated circuit is considered but the scan test is not considered in determination of the cell position.

Accordingly, a distance between the scan chain and the compression scan circuit is lengthened in the semiconductor integrated circuit, which is obtained based on the layout data. As a result, a wire length of a wire (hereinafter referred to as a "scan wire") connecting the scan chain and the compression scan circuit increases, which obstructs integration of the semiconductor integrated circuit.

DETAILED DESCRIPTION

Embodiments will now be explained with reference to the accompanying drawings.

In general, according to one embodiment, a designing apparatus includes a register position determining module, a net list generator, and a layout data generator. The register position determining module determines a register position on a layout of a semiconductor integrated circuit from a hardware description. The net list generator generates a net list according to the register position. The layout data generator generates layout data based on the net list. The layout data indicates the layout of the semiconductor integrated circuit.

Figure 1:
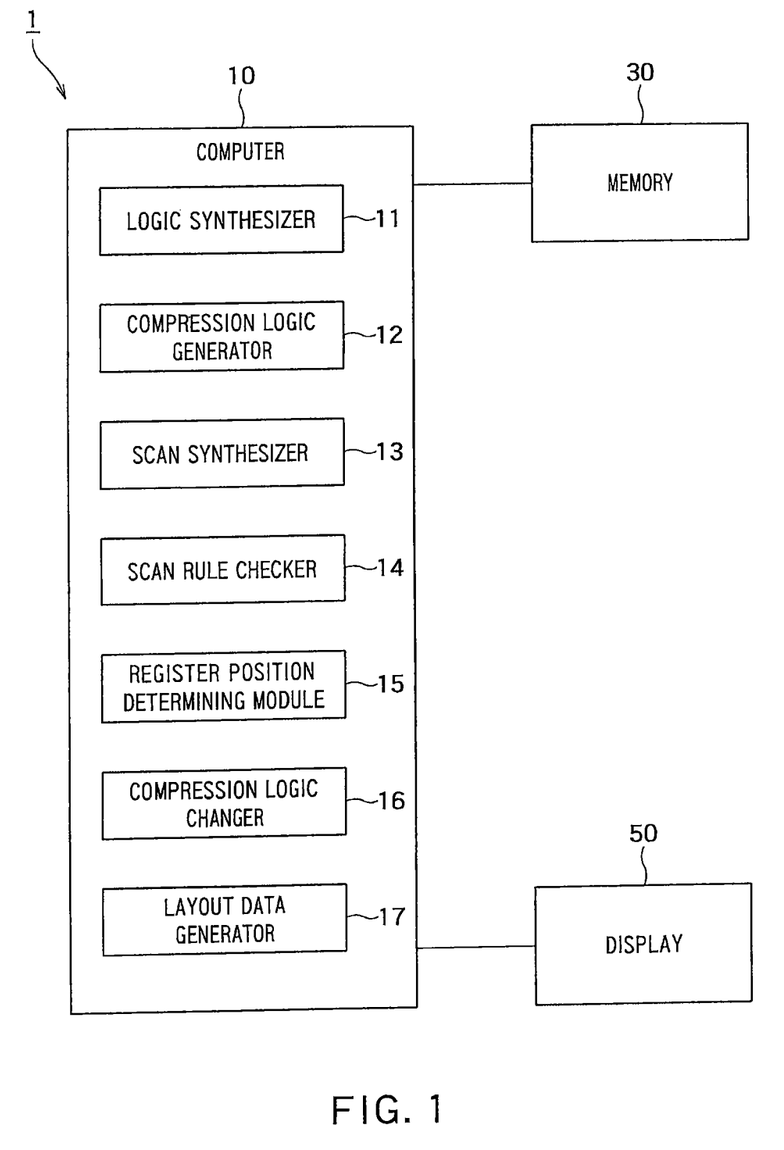
FIG. 1 is a block diagram illustrating a configuration of a design apparatus 1 of the embodiment.

A configuration of a design apparatus according to an embodiment will be described. FIG. 1 is a block diagram illustrating a configuration of a design apparatus 1 of the embodiment.

As illustrated in FIG. 1, the design apparatus 1 includes a computer 10, a memory 30, and a display 50. A design program is stored in the memory 30. The design program means a program that causes the computer 10 to perform a designing process of the embodiment.

The computer 10 activates the design program to implement a logic synthesizer 11, a compression logic generator 12, a scan synthesizer 13, a scan rule checker 14, a register position determining module 15, a compression logic changer 16, and a layout data generator 17. Each module of the computer 10 is described later. For example, the computer 10 is a CPU (Central Processing Unit).

Not only the design program but also various pieces of data necessary for the designing process are stored in the memory 30. For example, the data necessary for the designing process is a Register Transfer Level (hereinafter referred to as an "RTL") description. The RTL description means data indicating a register-level operation of the semiconductor integrated circuit to be designed.

The display 50 displays an image indicating a processing result of the computer 10. For example, the display 50 is an LCD (Liquid Crystal Display).

Figure 2:
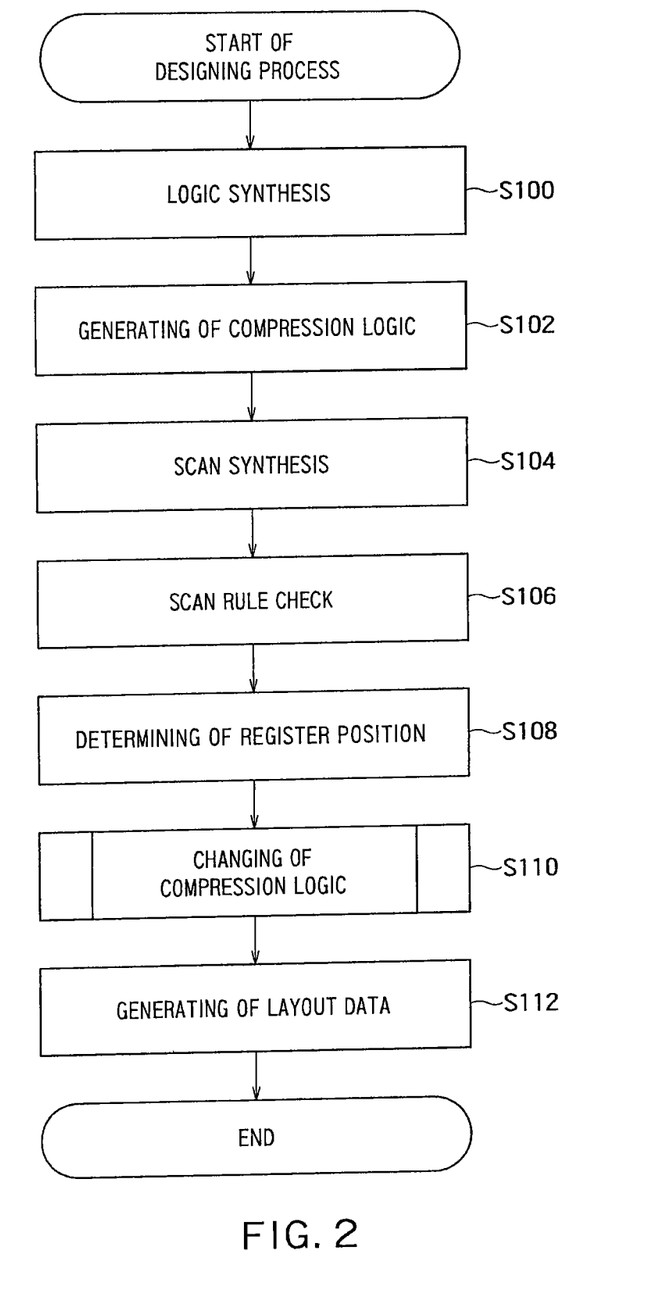
FIG. 2 is a flowchart of the designing process of the embodiment.

An operation of the design apparatus of the embodiment will be described below. FIG. 2 is a flowchart of the designing process of the embodiment.

<S100> The logic synthesizer 11 performs logic synthesis with respect to the RTL description to generate a hardware description. The hardware description means data indicating a configuration (for example, a register array) of the semiconductor integrated circuit, which implements the operation indicated by the RTL description. For example, the hardware description is an HDL (Hardware Description Language) description.

<S102> The compression logic generator 12 adds a compression scan description indicating a compression scan circuit and a decompression scan description indicating a decompression scan circuit to the hardware description obtained in S100. The compression scan circuit aggregates scan wires connected to plural registers in order to compress a test pattern size of the semiconductor integrated circuit. The decompression scan description can be omitted.

Figure 3A:
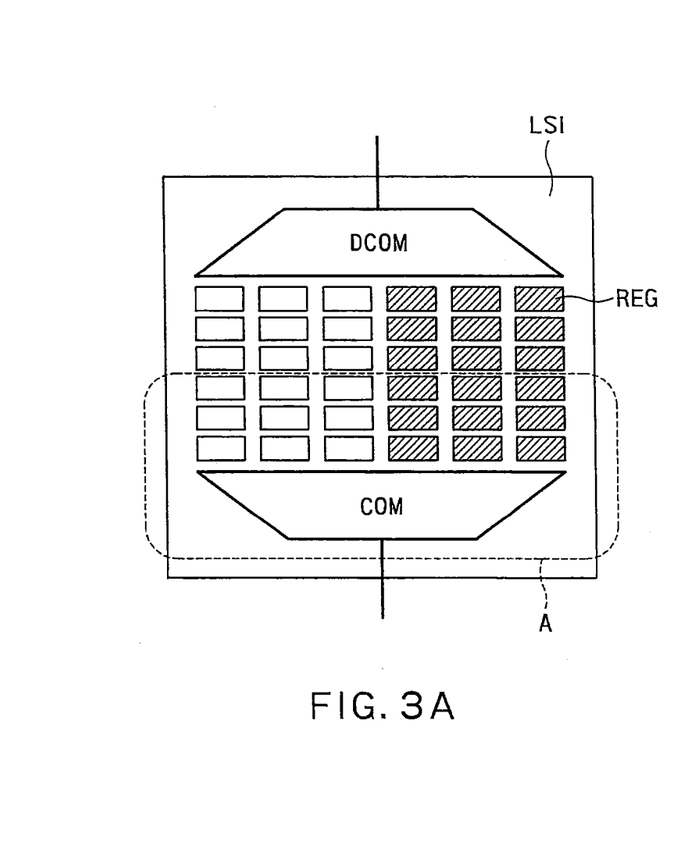
FIG. 3A is a configuration diagram of the semiconductor integrated circuit corresponding to the first net list obtained in S104 of the embodiment.

<S104> The scan synthesizer 13 performs scan synthesis with respect to the hardware description (that is, the hardware description includes at least the compression scan description) obtained in S102 to generate a first net list. The first net list means data indicating inter-terminal connection (for example, connection between two registers) of the configuration of the semiconductor integrated circuit corresponding to the hardware description obtained in S102. For example, the scan synthesizer 13 rewrites the hardware description such that a scan chain is constituted in each functional group in the semiconductor integrated circuit corresponding to the hardware description obtained in S102. Therefore, the first net list is obtained. FIG. 3 is a configuration diagram of the semiconductor integrated circuit corresponding to the first net list obtained in S104 of the embodiment.

As illustrated in FIG. 3A, a semiconductor integrated circuit LSI corresponding to the first net list includes plural registers REG, a compression scan circuit COM, and a decompression scan circuit DCOM.

Figure 3B:
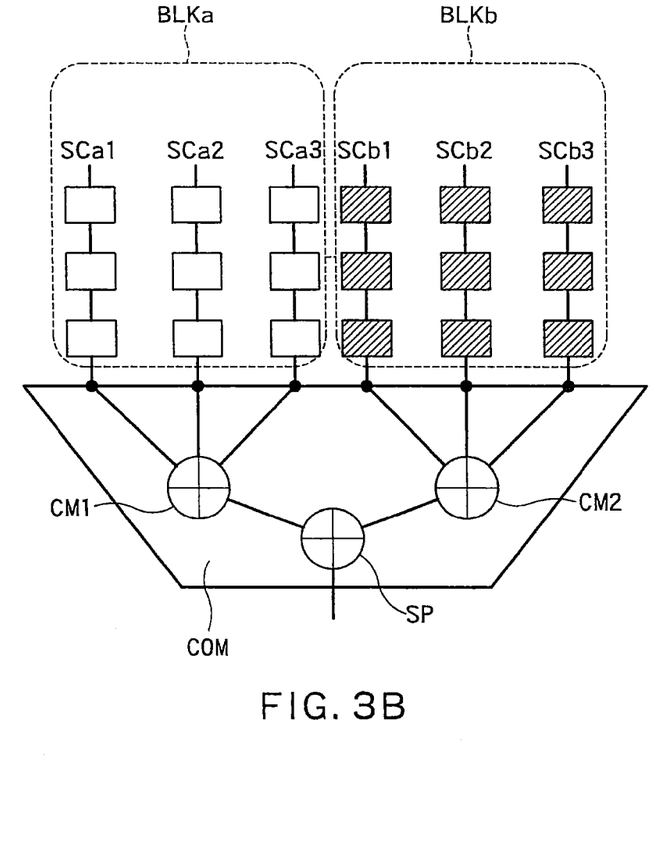
FIG. 3B is an enlarged view of a region surrounded by a broken line A in FIG. 3A.

FIG. 3B is an enlarged view of a region surrounded by a broken line A in FIG. 3A. As illustrated in FIG. 3B, the registers REG constitute scan chains SCa1 to SCa3 and SCb1 to SCb3.

The scan chains SCa1 to SCa3 and SCb1 to SCb3 are aggregated in each functional block (functional blocks BLKa and BLkb). Therefore, the scan chains SCa1 to SCa3 constitute the functional block BLKa and the scan chains SCb1 to SCb3 constitute the functional block BLKb.

The compression scan circuit COM includes plural compressors CM1, CM2, and SP. For example, the compressors CM1, CM2, and SP are XOR elements.

The compressor CM1 is a module that aggregates the functional block BLKa (that is, the compressor CM1 integrates the scan wires connected to the scan chains SCa1 to SCa3). The compressor CM2 is a module that aggregates the functional block BLKb (that is, the compressor CM2 integrates the scan wire connected to the scan chains SCb1 to SCb3). The compressor SP is a module that further compresses outputs of the compressors CM1 and CM2 and outputs the compressed outputs.

<S106> Based on an operation constraint of the semiconductor integrated circuit, the scan rule checker 14 checks whether the semiconductor integrated circuit corresponding to the first net list satisfies the operation constraint. When the semiconductor integrated circuit does not satisfy the operation constraint, S100 to S104 are performed again after at least one of the RTL description and the hardware description is corrected.

<S108> Based on the first net list, the register position determining module 15 determines a register position on a layout of the semiconductor integrated circuit from the hardware description.

Figure 4:
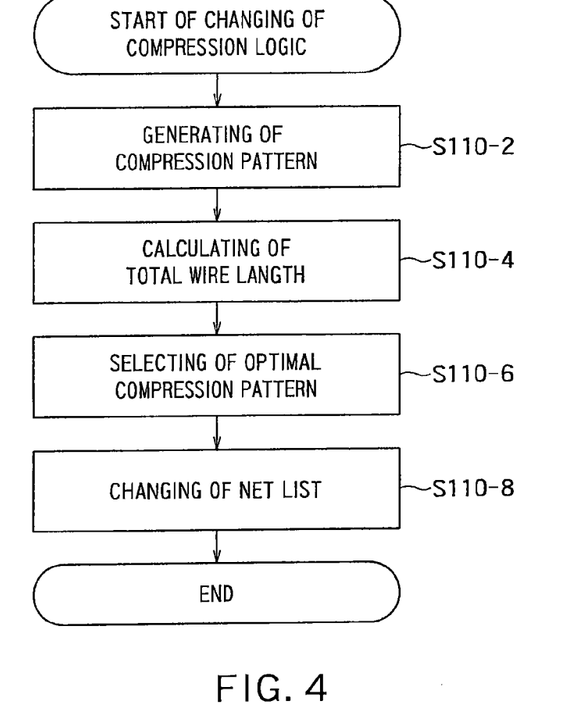
FIG. 4 is a flowchart of changing the compression logic (S110) of the embodiment.

<S110> The compression logic changer 16 changes a compression logic. In changing the compression logic, based on the register position, the compression logic changer 16 changes the configuration (for example, a connection relationship between the compressor and the scan chain) of the compression scan circuit COM such that a total wire length of the scan wires in the semiconductor integrated circuit LSI is shortened, and then the compression logic changer 16 generates a second net list. The second net list means data indicating a relationship of inter-terminal connection (for example, connection between two registers) of the configuration of the semiconductor integrated circuit corresponding to the configuration of the post-change compression scan circuit COM. FIG. 4 is a flowchart of changing the compression logic (S110) of the embodiment.

<S110-2> The compression logic changer 16 generates a compression pattern in each combination of the compressors CM1 and CM2 and the scan chains SCa1 to SCa3 and SCb1 to SCb3

Figure 5:
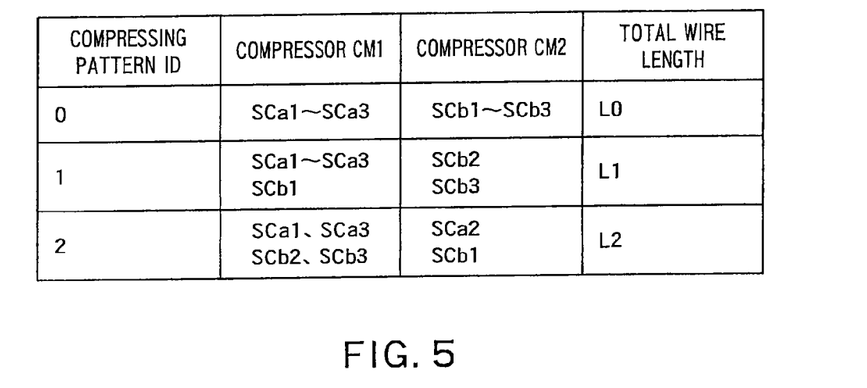
FIG. 5 is a schematic diagram of the compression pattern table obtained by calculating the total wire length (S110-4) of the embodiment.

<S110-4> The compression logic changer 16 calculates the total wire length in each compression pattern generated in S110-2, and generates a compression pattern table. For example, the compression logic changer 16 calculates the total wire length in each compression pattern based on positional information indicating positions of the compressors CM1 and CM2 and positional information indicating positions of the scan chains SCa1 to SCa3 and SCb1 to SCb3 in the resister position determined in S108. Therefore, the compression pattern table is obtained. FIG. 5 is a schematic diagram of the compression pattern table obtained by calculating the total wire length (S110-4) of the embodiment.

As illustrated in FIG. 5, the compression pattern table includes items of "compressing pattern ID", "compressor CM1," "compressor CM2," and "total wire length." The "compressing pattern ID" indicates unique information in each compression pattern. The "compressor CM1" and the "compressor CM2" indicate the scan chains that are connected to the compressors CM1 and CM2, respectively. The "total wire length" indicates the total of wire lengths in each compression pattern. For example, the "total wire length" of L2 corresponding to the "compressing pattern ID" of 2 indicates the total of the wire lengths connecting the compressor CM1 with the scan chains SCa1, SCa3, SCb2, and SCb3 and the wire lengths connecting the compressor CM2 with the scan chains SCa2 and SCb1. The "compressing pattern ID" of 0 corresponds to the compression pattern before changing the compression logic (S110), namely, the compression pattern (see FIG. 3B) obtained in the scan synthesis (S104).

<S110-6> The compression logic changer 16 selects the compression pattern (hereinafter referred to as an "optimal compression pattern") whose total wire length is the shortest of the total wire lengths in each compression pattern which are calculated in S110-4. For example, in the case that the total wire length L2 in FIG. 5 is shorter than the total wire lengths L0 and L1, the compression logic changer 16 selects the compression pattern corresponding to the "compressing pattern ID" of 2 as the optimal compression pattern.

Figure 6:
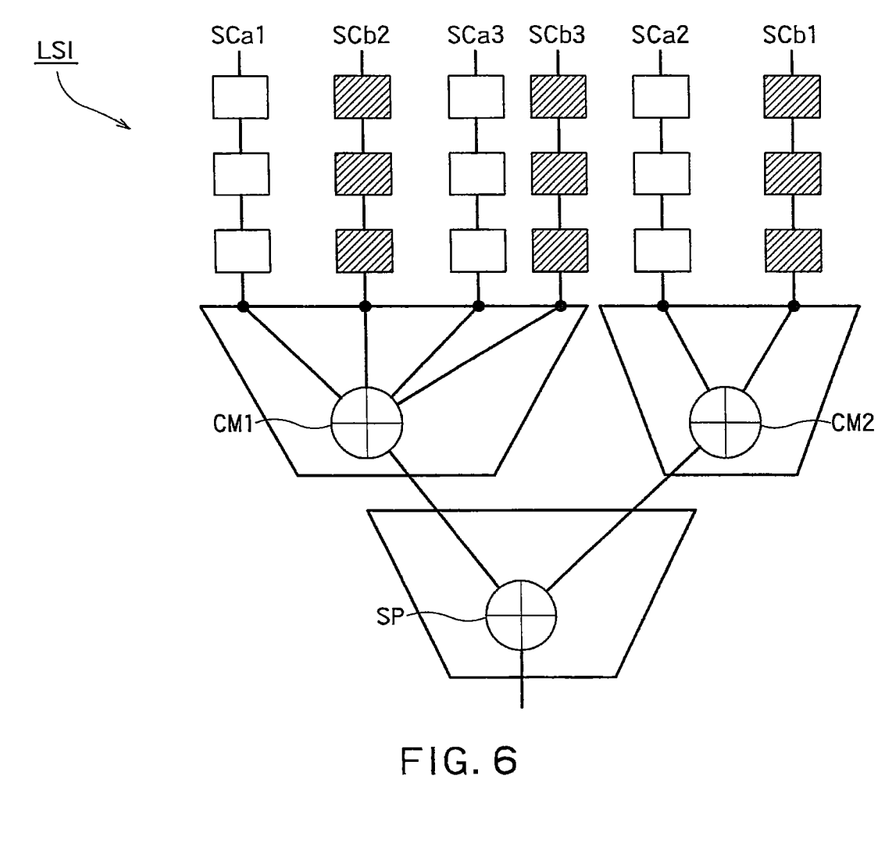
FIG. 6 is a configuration diagram of the semiconductor integrated circuit corresponding to the second net list obtained in changing of the net list (S110-8) of the embodiment.

<S110-8> The compression logic changer 16 generates the second net list based on the optimal compression pattern selected in S110-6. FIG. 6 is a configuration diagram of the semiconductor integrated circuit corresponding to the second net list obtained in changing of the net list (S110-8) of the embodiment.

As illustrated in FIG. 6, in the semiconductor integrated circuit LSI corresponding to the second net list, the compressor CM1 is connected to the scan chains SCa1, SCa3, SCb2, and SCb3, the compressor CM2 is connected to the scan chains SCa2 and SCb1, and the compressor SP is connected to the compressors CM1 and CM2. The "total wire length" of L2 between the compressors CM1 and CM2 and the scan chains SCa1 to SCa3 and SCb1 to SCb3 in FIG. 6 is shorter than the total wire length L0 between the compressors CM1 and CM2 and the scan chains SCa1 to SCa3 and SCb1 to SCb3 in FIG. 3.

<S112> The layout data generator 17 generates layout data based on the second net list, and outputs the layout data to the display 50. The layout data means data indicating a layout (for example, layouts of the compressor CM1 and CM2 and the scan chains SCa1 to SCa3 and SCb1 to SCb3) of the semiconductor integrated circuit LSI corresponding to the second net list.

Figure 7:
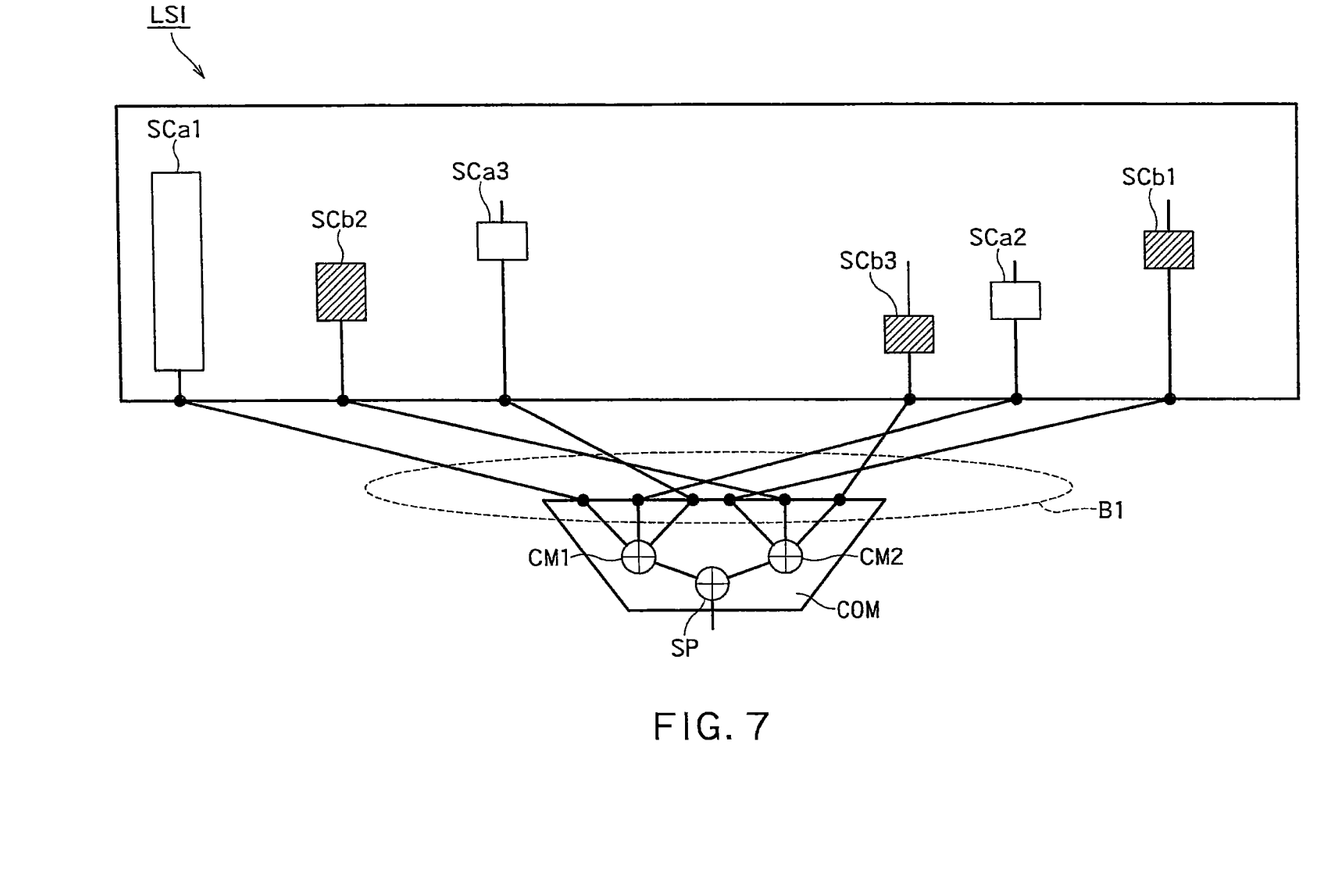
FIG. 7 is a schematic diagram of a semiconductor integrated circuit LSI corresponding to layout data obtained in the comparative example of the embodiment.
Figure 8:
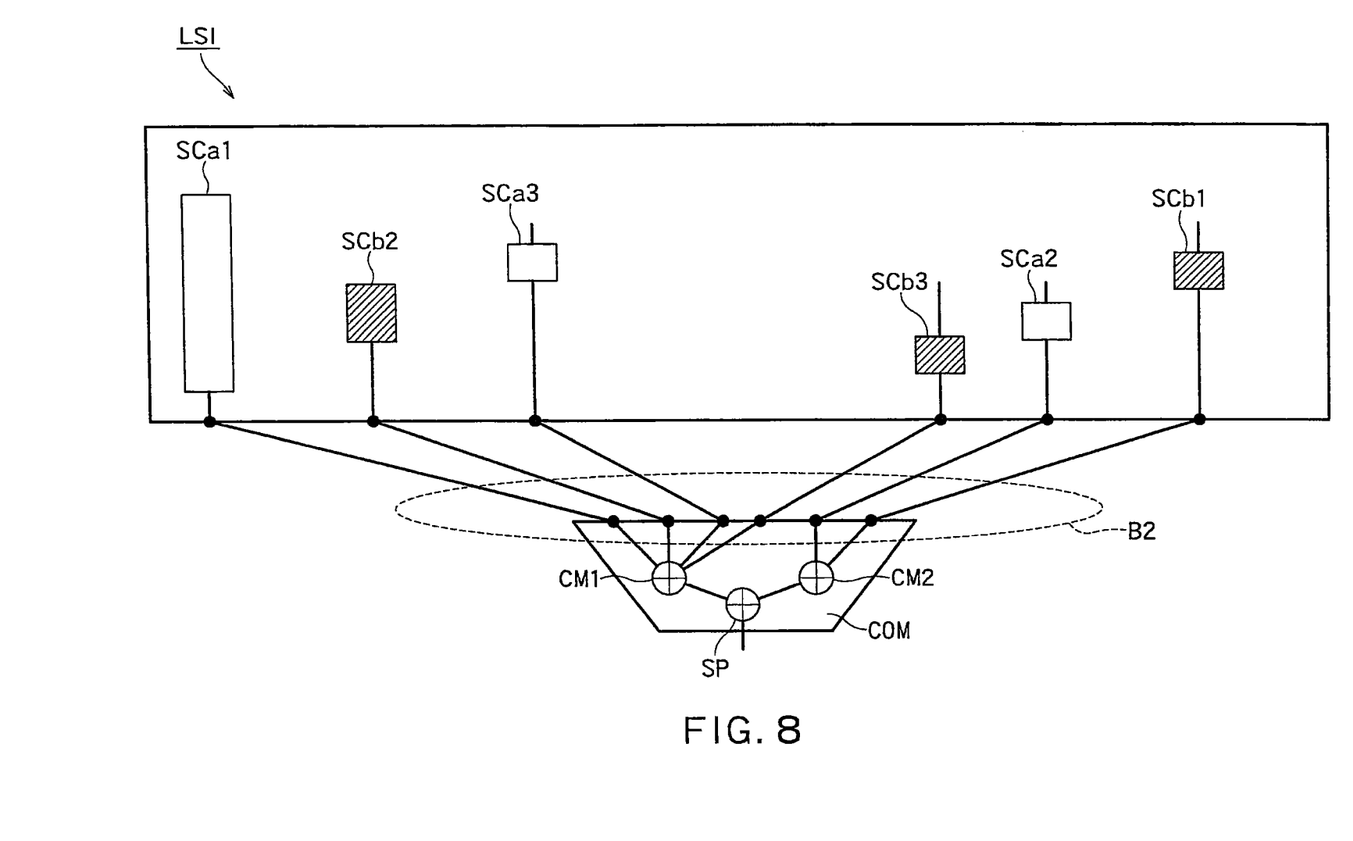
FIG. 8 is a schematic diagram of the semiconductor integrated circuit LSI corresponding to the layout data obtained through the designing process of the embodiment.

A comparative example of the embodiment will be described. FIG. 7 is a schematic diagram of a semiconductor integrated circuit LSI corresponding to layout data obtained in the comparative example of the embodiment. FIG. 8 is a schematic diagram of the semiconductor integrated circuit LSI corresponding to the layout data obtained through the designing process of the embodiment.

As illustrated in FIG. 7, in the layout data obtained through a general designing process, the wire lengths of the scan wires between the compression scan circuit COM and the scan chains SCa1 to SCa3 and SCb1 to SCb3 increase, and the congestion of the scan wires is deteriorated (see a broken line B1 in FIG. 7). This is because, in the general designing process, the layout data is generated from the net list (corresponding to the first net list of the embodiment), which is obtained by rewriting the hardware description, such that the scan chain is constituted, in each functional group.

On the other hand, as illustrated in FIG. 8, in the layout data obtained through the designing process of the embodiment, the wire lengths of the scan wires between the compression scan circuit COM and the scan chains SCa1 to SCa3 and SCb1 to SCb3 decrease, and the congestion of the scan wires is improved, compared with the semiconductor integrated circuit LSI in FIG. 7 (see a broken line B2 in FIG. 8). This is because, in the designing process of the embodiment, the layout data is generated from the net list (that is, the second net list of the embodiment) based on the positional information of the modules of the semiconductor integrated circuit LSI.

At least a portion of the design apparatus 1 according to the above-described embodiments may be composed of hardware or software. When at least a portion of the design apparatus 1 is composed of software, a program for executing at least some functions of the design apparatus 1 may be stored in a recording medium, such as a flexible disk or a CD-ROM, and a computer may read and execute the program. The recording medium is not limited to a removable recording medium, such as a magnetic disk or an optical disk, but it may be a fixed recording medium, such as a hard disk or a memory.

In addition, the program for executing at least some functions of the design apparatus 1 according to the above-described embodiment may be distributed through a communication line (which includes wireless communication) such as the Internet. In addition, the program may be encoded, modulated, or compressed and then distributed by wired communication or wireless communication such as the Internet. Alternatively, the program may be stored in a recording medium, and the recording medium having the program stored therein may be distributed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A designing apparatus, comprising:
a register position determining module configured to determine a register position on a layout of a semiconductor integrated circuit from a hardware description;
a net list generator configured to generate a net list according to the register position;
a layout data generator configured to generate layout data based on the net list, the layout data indicating the layout of the semiconductor integrated circuit; and
a compression logic generator configured to add a compression scan description to the hardware description, the compression scan description indicating a compression scan circuit,
wherein the net list generator comprises:
a scan synthesizer configured to perform scan synthesis with respect to the hardware description comprising the compression scan description to generate a first net list corresponding to a plurality of scan chains; and
a compression logic changer configured to change a configuration of the compression scan circuit based on the register position to convert the first net list into a second net list,
wherein the register position determining module determines the register position on the layout of the semiconductor integrated circuit corresponding to the first net list, and
wherein the layout data generator generates the layout data indicating the layout of the semiconductor integrated circuit corresponding to the second net list.

2. The apparatus of claim 1, wherein the compression logic changer changes the configuration of the compression scan circuit in such a manner that a total wire length of scan wires connecting the scan chains and the compression scan circuit decreases to generate the second net list.

3. The apparatus of claim 1, wherein the compression scan circuit comprises a plurality of compressors, and
the compression logic changer generates a compression pattern in each combination of the compressors and the scan chains, calculates a total wire length in each of the compression patterns, selects the compression pattern whose total wire length is the shortest of the total wire length in each of the compression patterns as an optimal compression pattern, and generates the second net list based on the optimal compression pattern.

4. The apparatus of claim 2, wherein the compression scan circuit comprises a plurality of compressors, and
the compression logic changer generates a compression pattern in each combination of the compressors and the scan chains, calculates a total wire length in each of the compression patterns, selects the compression pattern whose total wire length is the shortest of the total wire length in each of the compression patterns as an optimal compression pattern, and generates the second net list based on the optimal compression pattern.

5. A method, for designing a semiconductor integrated circuit comprising:
determining, by a processor, a register position on a layout of a semiconductor integrated circuit from a hardware description;
generating, by the processor, a net list according to the register position;

generating, by the processor, layout data based on the net list, the layout data indicating the layout of the semiconductor integrated circuit; and adding, by the processor, a compression scan description to the hardware description, the compression scan description indicating a compression scan circuit, wherein in generating the net list, scan synthesis with respect to the hardware description comprising the compression scan description is performed to generate a first net list corresponding to a plurality of scan chains, and a configuration of the compression scan circuit is changed on the basis of the register position to convert the first net list into a second net list, wherein in determining the register position, the register position on the layout of the semiconductor integrated circuit corresponding to the first net list is determined, and wherein the layout data indicating the layout of the semiconductor integrated circuit corresponding to the second net list is generated.

6. The method of claim 5, wherein in the configuration of the compression scan circuit is changed, the configuration of the compression scan circuit is changed in such a manner that a total wire length of scan wires connecting the scan chains and the compression scan circuit decreases to generate the second net list.

7. The method of claim 5, wherein the compression scan circuit comprises a plurality of compressors, and in the configuration of the compression scan circuit is changed, a compression pattern in each combination of the compressors and the scan chains is generated, a total wire length in each of the compression patterns is calculated, the compression pattern whose total wire length is the shortest of the total wire length in each of the compression patterns is selected as an optimal compression pattern, and the second net list is generated on the basis of the optimal compression pattern.

8. The method of claim 6, wherein the compression scan circuit comprises a plurality of compressors, and in the configuration of the compression scan circuit is changed, a compression pattern in each combination of the compressors and the scan chains is generated, a total wire length in each of the compression patterns is calculated, the compression pattern whose total wire length is the shortest of the total wire length in each of the compression patterns is selected as an optimal compression pattern, and the second net list is generated on the basis of the optimal compression pattern.

9. A non-transitory computer readable medium storing computer executable instructions for designing a semiconductor integrated circuit, which when executed on a computer perform operations comprising:

determining a register position on a layout of a semiconductor integrated circuit from a hardware description;

generating a net list according to the register position;

generating layout data based on the net list, the layout data indicating the layout of the semiconductor integrated circuit; and adding a compression scan description to the hardware description, the compression scan description indicating a compression scan circuit, wherein in generating the net list, scan synthesis with respect to the hardware description comprising the compression scan description is performed to generate a first net list corresponding to a plurality of scan chains, and a configuration of the compression scan circuit is changed on the basis of the register position to convert the first net list into a second net list, wherein in determining the register position, the register position on the layout of the semiconductor integrated circuit corresponding to the first net list is determined, and wherein the layout data indicating the layout of the semiconductor integrated circuit corresponding to the second net list is generated.

10. The non-transitory computer readable medium of claim 9, further comprising adding a compression scan description to the hardware description, the compression scan description indicating a compression scan circuit, wherein in generating the net list, scan synthesis with respect to the hardware description comprising the compression scan description is performed to generate a first net list corresponding to a plurality of scan chains, and a configuration of the compression scan circuit is changed on the basis of the register position to convert the first net list into a second net list, wherein in determining the register position, the register position on the layout of the semiconductor integrated circuit corresponding to the first net list is determined, and wherein the layout data indicating the layout of the semiconductor integrated circuit corresponding to the second net list is generated.

11. The non-transitory computer readable medium of claim 10, wherein in the configuration of the compression scan circuit is changed, the configuration of the compression scan circuit is changed in such a manner that a total wire length of scan wires connecting the scan chains and the compression scan circuit decreases to generate the second net list.

12. The non-transitory computer readable medium of claim 10, wherein the compression scan circuit comprises a plurality of compressors, and in the configuration of the compression scan circuit is changed, a compression pattern in each combination of the compressors and the scan chains is generated, a total wire length in each of the compression patterns is calculated, the compression pattern whose total wire length is the shortest of the total wire length in each of the compression patterns is selected as an optimal compression pattern, and the second net list is generated on the basis of the optimal compression pattern.

13. The non-transitory computer readable medium of claim 11, wherein the compression scan circuit comprises a plurality of compressors, and in the configuration of the compression scan circuit is changed, a compression pattern in each combination of the compressors and the scan chains is generated, a total wire length in each of the compression patterns is calculated, the compression pattern whose total wire length is the shortest of the total wire length in each of the compression patterns is selected as an optimal compression pattern, and the second net list is generated on the basis of the optimal compression pattern.

* * * * *